United States Patent [19]

Najji

[11] Patent Number: 4,903,105
[45] Date of Patent: Feb. 20, 1990

[54] THYRISTOR OR TRIAC WITH EMITTER SHORTING STRIPES

[75] Inventor: Jean-Paul Najji, Tours, France

[73] Assignee: SGS-Thomson Microelectronics S.A., Gentilly, France

[21] Appl. No.: 214,254

[22] Filed: Jul. 1, 1988

[30] Foreign Application Priority Data

Jul. 3, 1987 [FR] France ................ 87 09456

[51] Int. Cl.$^4$ .............. H01L 29/74; H01L 29/747
[52] U.S. Cl. ........................ 357/38; 357/39; 357/86
[58] Field of Search ............... 357/39, 38, 86

[56] References Cited

U.S. PATENT DOCUMENTS

| 3,792,320 | 2/1974 | Hutson | 357/38 |
| 4,641,175 | 2/1987 | Shiraishi | 357/39 |
| 4,812,893 | 7/1986 | Bacuvier | 357/39 |

FOREIGN PATENT DOCUMENTS

| 2137666 | 5/1972 | European Pat. Off. | |
| 0035841 | 2/1981 | European Pat. Off. | |
| 074885 | 7/1978 | Japan | 357/38 |
| 189261 | 9/1985 | Japan | 357/38 |
| 8700971 | 2/1987 | PCT Int'l Appl. | |
| 1387025 | 3/1973 | United Kingdom. | |

Primary Examiner—Robert P. Limanek
Attorney, Agent, or Firm—Lowe, Price, Leblanc, Becker & Shur

[57] ABSTRACT

The instant invention relates to thyristors and triacs. In order to desensitize thyristors and triacs, it is usual to provide for emitter shorts through which the gate region crosses the emitter region. Those holes are generally scattered on the whole surface of the emitter region. According to the instant invention, they are grouped in the form of narrow stripes such as the stripes 30 and 32 shown in the figure. It is to be appreciated that a substantial improvement of the triggering uniformity is achieved fror thyristors and triacs, and, for triacs, an improvement from the ON to the OFF state is achieved thanks to a better extraction of the charges stored during the conduction phase.

5 Claims, 8 Drawing Sheets

THYRISTOR OR TRIAC WITH EMITTER SHORTING STRIPES

BACKGROUND OF THE INVENTION

The instant invention relates to switches for semiconductors, and more precisely to triacs, but in certain cases it can also apply to thyristors.

It is reminded that a triac is constituted by two reverse connected thyristors arranged side by side on a same semiconductive chip. Each thyristor is constituted by the superimposition of four semiconductive layers of alternative conductivity types, NPNP, which are respectively a P-type anode layer, a N-type central layer common to two thyristors, a P-type gate layer, and a N-type emitter layer. On the back face of the chip, a first main metallization overlays both the anode layer of one of the thyristors and the emitter layer of the other thyristor; on the front face, a second main metallization overlays both the emitter layer of the first thyristor and the anode layer of the other thyristor while a gate metallization overlays a portion of the gate layer of the first thyristor where this layer is apparent.

This arrangement corresponds generally to the structure of any triac, and the front face and back face of a conventional triac are shown in FIGS. 1 and 2, respectively. More precisely, one sees on those figures the surface portions of the various layers of the N- and P-type on the front and back faces. The cross-hatched areas show the surface of the N-type layers; the white areas show the surface of the P-type layers. The solid lines delimit the separation of those areas; the dotted lines show the outline of the metallizations which contact with the semiconductor surface portions.

In FIG. 1 (front face), reference 10 designates the surface of the emitter layer of the first thyristor; reference 12 designates the surface of the anode layer of the second thyristor; reference 14 designates a surface portion of the gate layer of the first thyristor; reference 16 designates a portion of the N-type not overlaid by the first main metallization but overlaid by a gate metallization.

The outline of the first main metallization is representation by the dotted line 18; this line surrounds the greater part of the region 10 and the greater part of the region 12.

The outline of the gate metallization is represented by the dotted line 20. It includes the region 14 and a portion of the region 16.

As it is apparent from the drawings, the front face of the triac is generally divided into two main areas separated by a diagonal of the rectangle or the square constituting this front face; the first area essentially includes the emitter region 10 and the first thyristor is located perpendicularly to this region; the second are essentially includes the anode region 12 and the second thyristor is located perpendicularly to this region. The same general partition exists on the back face. The boundary area between the two thyristors is a critical area for the good switching operation of the triac.

On the back face of the triac, shown in FIG. 2, one essentially finds a P-type region 22 which is part of the anode layer of the first thyristor, and a N-type region 24 which is part of the emitter layer of the second thyristor; those two regions are essentially separated by a diagonal which corresponds to the diagonal mentioned in FIG. 1. Regions 22 and 24 of the back face are overlaid by the second main metallization, the outline of which is represented by the dotted line 26.

To end the description of the very conventional triac shown in FIGS. 1 and 2, it will be noted that the emitter shorting holes 28, which are small P-type regions crossing the emitter layer towards the main metallization from the gate layer, generally both on the back face and on the front face. The function of those holes is, on the one hand, to improve the triggering of the triac when a gate current is present, and on the other hand, to facilitate the turn off of the triac while permitting to extract the charges stored during the triac conduction phase.

One of the objects of the invention is to provide for an arrangement of the shorting holes which optimizes the triggering and blocking features of triacs.

SUMMARY OF THE INVENTION

Up to now, the shorting holes were in practice arranged rather uniformly onto the surface of the emitter region through which they move upwards. The concentration of the holes was low, because the total cumulated surface of the holes has, of course, to be limited so that the triac is able to lead a sufficient current density out of the holes. The inventors have discovered that the triggering and blocking features were improved by non-uniformly distributing the holes, and more precisely by concentrating them in the form of narrow stripes crossing substantially the whole surface of the emitter region. Those narrow stripes are preferentially continuous, but one remains in the scope of the invention if they are discontinuous provided that the distribution of the holes essentially corresponds to a high concentration of holes in one or several narrow stripes instead of a relatively low and uniform concentration as in the prior art.

To formulate in a calculable way the arrangement according to the invention, meanwhile considering several practical arrangements which can be adopted while remaining in the scope of the invention, one proposes to consider on the emitter surface an imaginary narrow stripe capable to contain a high concentration of holes and to study the total cumulated surface of one or several holes in this stripe with respect to the surface of the corresponding emitter region. According to the invention, and contrary to the prior art which involved a rather uniform arrangement, at least one portion of the shorting holes are grouped inside at least one elongated narrow stripe extending through the surface of the emitter region, the ratio between the cumulated surface of the shorting holes in this stripe and the surface of the stripe being at least 30%. The ratio reaches 100% if the narrow stripe entirely forms an elongated emitter short.

According to the invention, it has been noted that this arrangement provides excellent results for triacs, and is also very advantageous for thyristors.

Preferably, such a narrow stripe with a high surface ratio of holes is positioned along the boundary area between the two thyristors of the triac. Further stripes, angled with respect to the first one, can be provided for.

If the shorting holes are not constituted by narrow stripes, they are then constituted by square, rectangular or round (the conventional shape of the holes) holes, set very close from each other, so as to obtain the hereinabove determined ratio between the cumulated surface of the holes and the surface of a narrow stripe containing those holes.

BRIEF DISCLOSURE OF THE DRAWINGS

Other features and advantages of the instant invention will clearly appear in the following detailed description of preferred embodiments, in connection with the attached drawings, wherein:

FIGS. 1 and 2, already disclosed, respectively show a top view and a bottom view of a conventional triac with a low and regular concentration of holes in the emitter area;

FIGS. 3 and 4 respectively show a top view and a bottom view of a triac according to the invention with shorting holes of the elongated stripe type;

Figure 1:
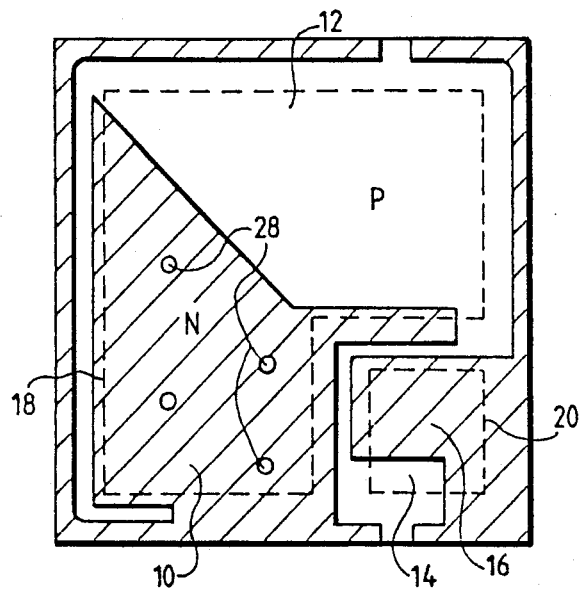

In the following figures, the references are the same as in FIGS. 1 and 2 for the same components.

The emitter shorting holes are in this case constituted by two elongated stripes 30 and 32 on the front face of the triac and by two elongated stripes 34 and 36 on the back face.

Those stripes are narrow stripes which extend through the largest part of the surface of the emitter region.

They improve the triggering performance of the thyristor, and, for simplifying the extraction of the charges when the thyristor switches off, one preferentially provides that the stripe 30 extends close to the boundary area between the surface regions N and P contacted by the metallization 18 of the front face; as shown in the drawing, the stripe 30 essentially extends parallel to this boundary region which is diagonal.

The other stripe 32 can be parallel or preferably angled with respect to stripe 30; it also crosses the largest part of the surface of the emitter region.

On the back face, the stripes 34 and 36 have analog configurations compared with stripe 30 and 32, respectively.

Figure 5:
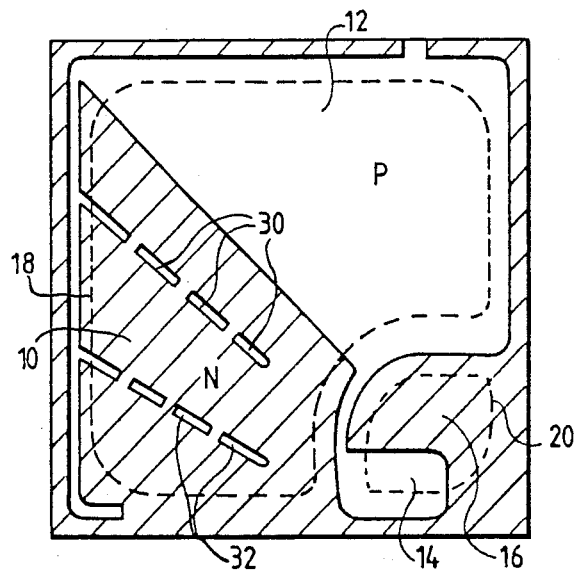
FIGS. 5 and 6 show another embodiment wherein the shorting holes are discontinuous elongated stripes.
Figure 6:
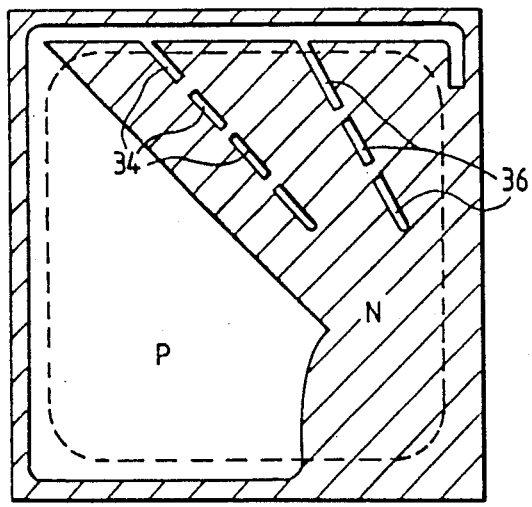

In other embodiments, the shorting holes are discontinuous stripes such as those shown in FIGS. 5 and 6.

Figure 7:
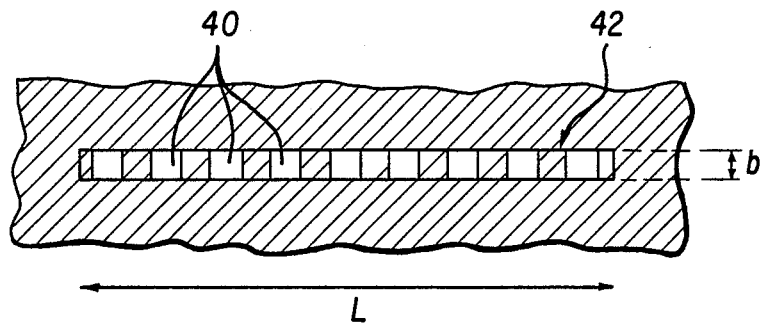
FIGS. 7 and 8 show further embodiments wherein the shorting holes are round or square holes concentrated in elongated narrow stripes.
Figure 8:
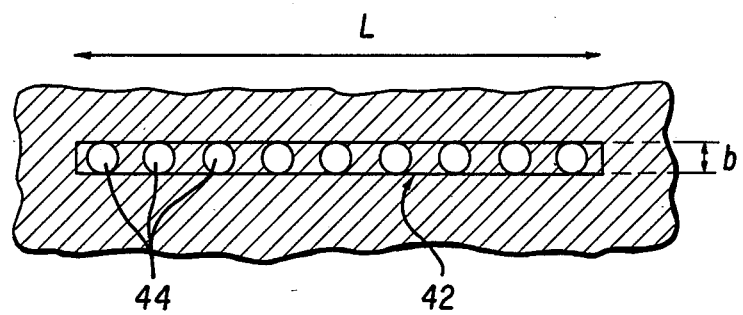

FIGS. 7 and 8 show two other embodiments of the shorting holes according to the invention; FIG. 7, the holes are square holes 40 and on FIG. 8 they are round holes 44. But in both cases, those holes are concentrated in at least one narrow rectangular stripe.

In order to distinguish this feature from the prior art wherein the holes were scattered and rather uniformly arranged within the emitter area, it can be ascertained that it is now possible to define an imaginary narrow stripe 42 (imaginary means this stripe is not really carried out on the chip) which includes a large concentration of holes. The words "narrow stripe", are to be construed as designating a stripe having a width b and a length L, the length L being at least 10 times larger than the width b; the words "high concentration of holes", have to be construed as indicating that the cumulated surface of holes in the stripe 42 is equal to at least 30% of the stripe surface.

In other words, according to the invention, one can determine a stripe 42 with a width b and a length L ($L > 10b$) such as $S > 0.3\ L.b$, where S represents the cumulated surface of the holes.

For example, in the case of FIG. 7, if there are n square holes spaced the ones from the others with a distance equal to the width of the squares, it is possible to determine a stripe having for a width the width of the squares; the ratio between the cumulated surface of the squares and the whole surface of the stripe including those square is 50%.

FIG. 8 shows a further embodiment wherein the holes are round and the ratio between the surface occupied by the holes and the surface L.b of the stripe is about 40%.

The advantages of the invention also appear when the invention is applied to the specific triac structure disclosed in the U.S. Pat. No. 4,812,893 to Bacuvier which is incorporated by reference.

Figure 9:
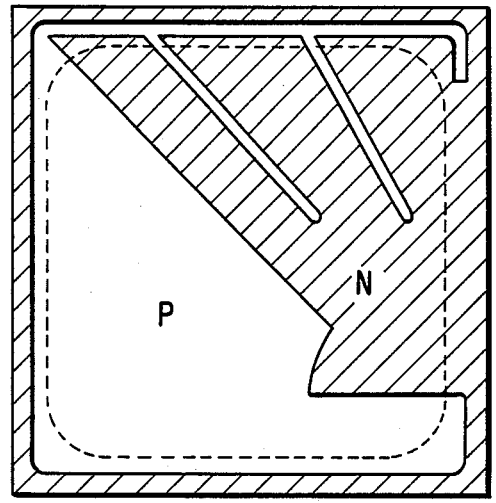
FIGS. 9 to 14 show other embodiments of the invention applied to the specific triac structure disclosed in the PCT patent application No WO 87/00971.
Figure 10:
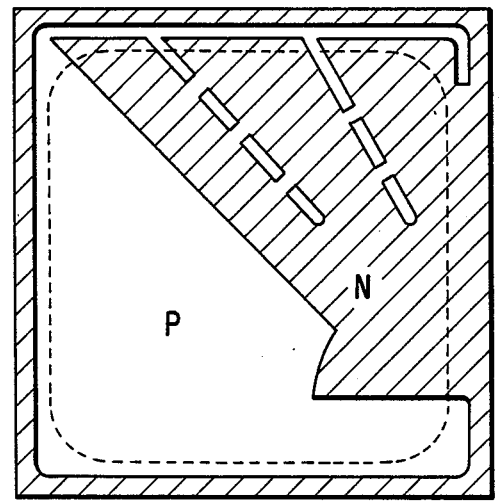
Figure 11:
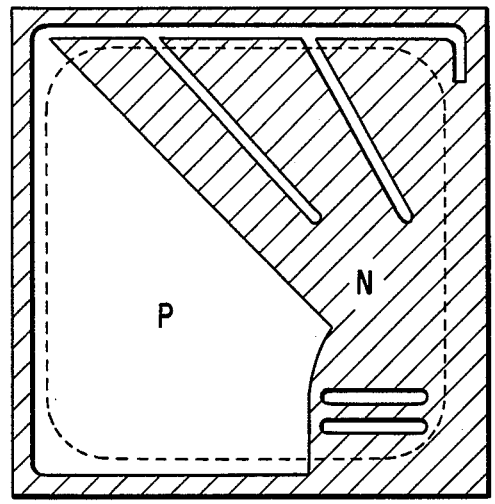
Figure 12:
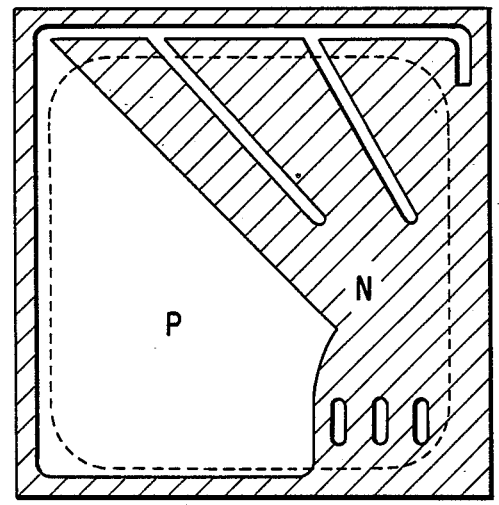
Figure 13:
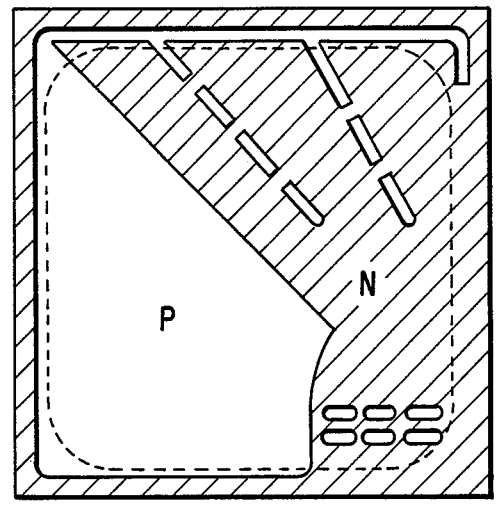
Figure 14:
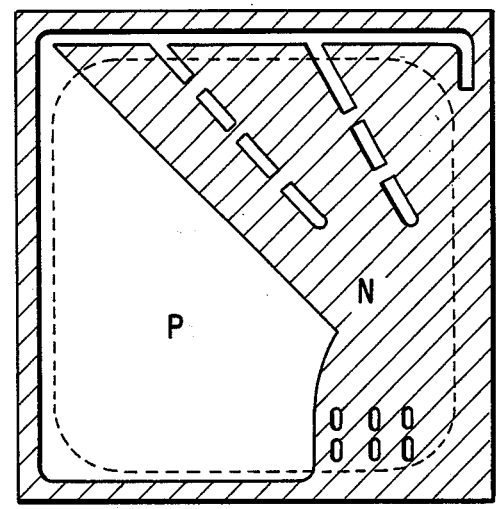

The shorting structure of FIG. 8 of the Bacuvier patent can be changed as shown in the attached FIG. 9 or 10. And the shorting structure of FIG. 11 of this PCT application can be changed as shown in the attached FIGS. 11, 12, 13 or 14.

FIGS. 9 to 14 will be easily understand from the former figures of the present application and from the figures of the referenced Bacuvier patent and will not be disclosed in greater detail.

Figure 15:
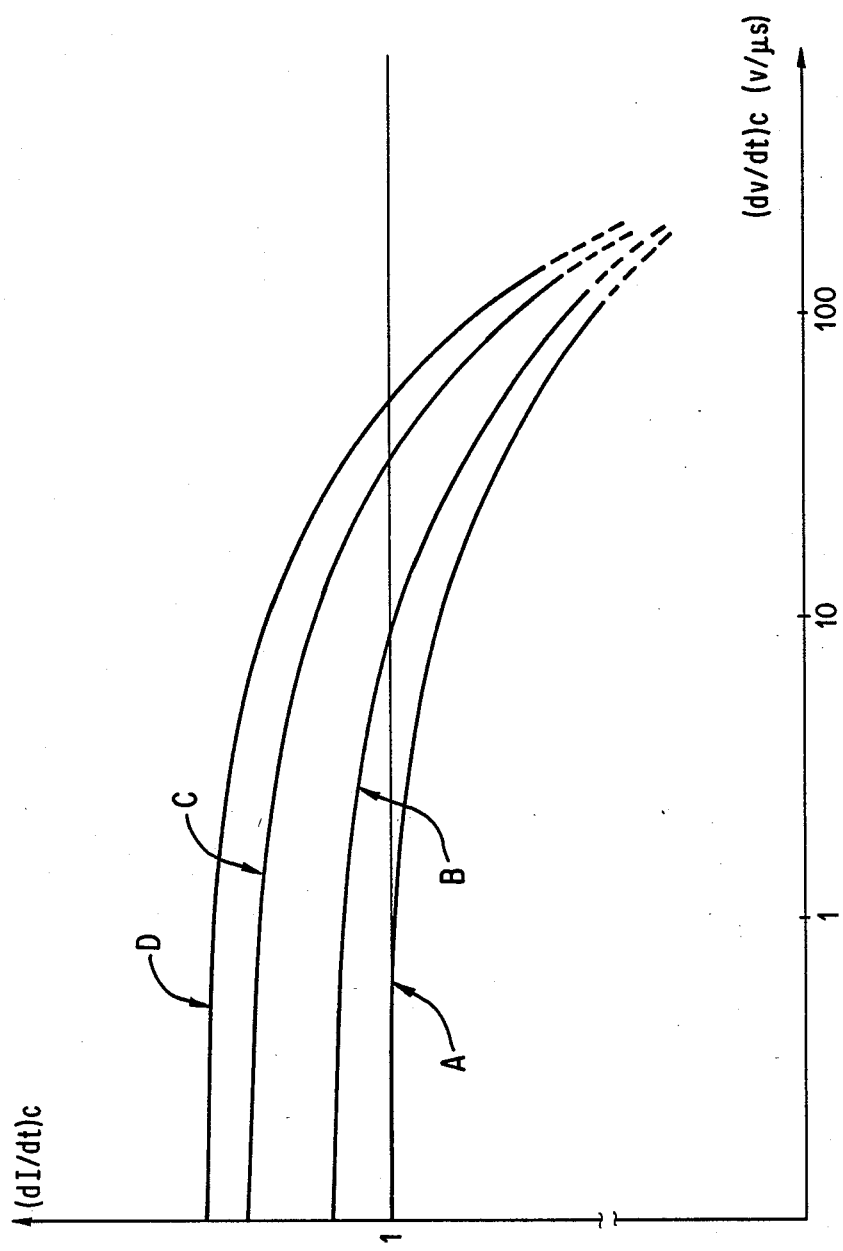
FIG. 15 show curves emphasizing the advantages of the invention.

FIG. 15 illustrates the advantages of the invention. The ordinates represent the current variation versus time at the switching off $(dI/dt)c$. The abscissae represent the voltage variation versus time at the switching off $(dV/dt)c$.

Figure 2:
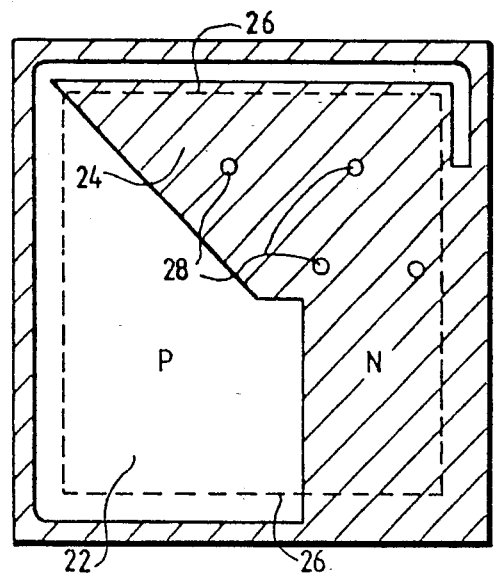
Figure 3:
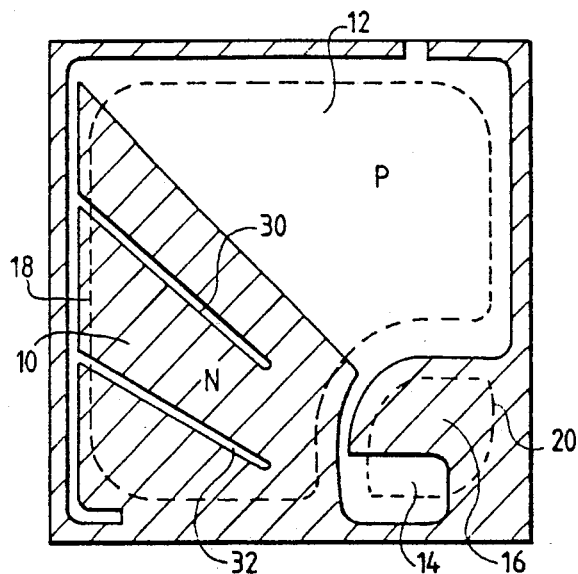
Figure 4:
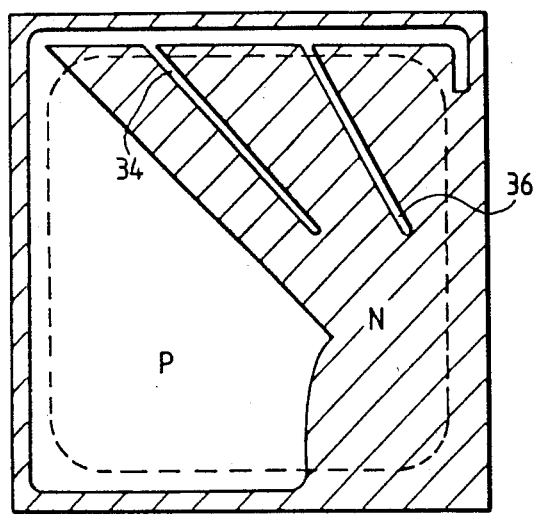

Curve A corresponds to a conventional triac as shown in FIGS. 1 and 2.

Curve B corresponds to a conventional triac modified as per the invention, as shown in FIGS. 3 to 6.

Curve C corresponds to a triac according to the Bacuvier patent.

Curve D corresponds to a triac according to the Bacuvier patent modified as per the invention, as shown in FIGS. 9 to 14.

Curves A to D emphasize the advantages of the the invention and indicate in particular that the advantages of the invention are cumulative with the advantages of the Bacuvier patent.

I claim:

1. A thyristor comprising an emitter region, a gate region, a central region and an anode region, the emitter region having one surface overlaid by an emitter metallization, with emitter shorts through which the gate region crosses the emitter region and contact the emitter metallization, wherein substantially all of said emitter shorts are groups into a maximum of two narrow elongated stripes extending through the surface of the emitter region whereby said emitter region, a ratio between the cumulated surface of the emitter shorts of each of said stripes and a surface of the respective stripe is greater than 0.30.

2. A triac comprising two reverse connected thyristors positioned side by side on a common semiconductor substrate, each of the thyristors comprising an emitter region, a gate region, a central region common to the two thyristors, an anode region, the emitter region having a surface overlaid by an emitter metallization, one of the thyristors comprising emitter shorts through which its gate region crosses its emitter region up to its metallization of emitter, wherein substantially all of said emitter shorts are grouped inside a maximum of two narrow elongated stripes extending through the surface of the emitter region whereby said emitter shorts are nonuniformly distributed over said emitter region of said one thyristor, a ratio between the cumulated surface of said shorts in each of said stripes and the whole surface of the respective stripe is greater than 0.30.

3. A triac according to claim 2, wherein one of said narrow elongated stripes is substantially parallel to a separation plane of said two thyristors of the triac.

4. A triac according to claim 3, further comprising at least one other narrow stripe angled with respect to the first one.

5. A triac according to claim s 2, wherein at least one short is constituted of one narrow elongated stripe.

* * * * *